US011978679B2

(12) United States Patent
Dror

(10) Patent No.: US 11,978,679 B2
(45) Date of Patent: May 7, 2024

(54) SUBSTRATE WITH CUT SEMICONDUCTOR PIECES HAVING MEASUREMENT TEST STRUCTURES FOR SEMICONDUCTOR METROLOGY

(71) Applicant: KLA Corporation, Milpitas, CA (US)

(72) Inventor: Chen Dror, Tivon (IL)

(73) Assignee: KLA Corporation, Milpitas, CA (US)

( * ) Notice: Subject to any disclaimer, the term of this patent is extended or adjusted under 35 U.S.C. 154(b) by 348 days.

(21) Appl. No.: 17/306,058

(22) Filed: May 3, 2021

(65) Prior Publication Data

US 2021/0351089 A1 Nov. 11, 2021

Related U.S. Application Data

(60) Provisional application No. 63/022,587, filed on May 11, 2020.

(51) Int. Cl.
*H01L 21/67* (2006.01)
*G05B 19/418* (2006.01)
*H01L 21/66* (2006.01)
*H01L 23/544* (2006.01)

(52) U.S. Cl.
CPC ........ *H01L 22/32* (2013.01); *G05B 19/41885* (2013.01); *H01L 21/67276* (2013.01); *H01L 22/20* (2013.01); *H01L 23/544* (2013.01); *G05B 2219/45031* (2013.01); *H01L 2223/54426* (2013.01)

(58) Field of Classification Search
CPC . H01L 21/67276; H01L 22/20; H01L 23/544; H01L 2223/54426; H01L 2223/54473; H01L 22/12; H01L 22/34
See application file for complete search history.

(56) References Cited

U.S. PATENT DOCUMENTS

| | | | | |
|---|---|---|---|---|
| 5,217,916 A | * | 6/1993 | Anderson | H01L 27/118 257/E27.11 |
| 5,448,165 A | * | 9/1995 | Hodge | H01L 22/20 324/762.04 |
| 5,634,267 A | * | 6/1997 | Farnworth | H01L 21/6835 257/E23.07 |
| 5,640,762 A | * | 6/1997 | Farnworth | G01R 1/0466 439/71 |
| 5,796,264 A | * | 8/1998 | Farnworth | H01L 23/49838 324/750.19 |
| 6,266,144 B1 | * | 7/2001 | Li | G03F 7/70433 356/23 |
| 6,763,578 B2 | * | 7/2004 | Farnworth | H01L 24/85 324/759.02 |
| 7,383,521 B2 | * | 6/2008 | Smith | G06F 30/39 716/120 |

(Continued)

*Primary Examiner* — Mounir S Amer
*Assistant Examiner* — Alexander Belousov
(74) *Attorney, Agent, or Firm* — Huse IP Law; Charles C. Huse

(57) ABSTRACT

A device used for semiconductor metrology includes a substrate and a plurality of pieces from one or more semiconductor wafers. Each piece of the plurality of pieces is bonded to the substrate at a respective position on the substrate. Each piece of the plurality of pieces includes a respective instance of a measurement test structure and an alignment mark. Each piece of the plurality of pieces has a known location from the one or more semiconductor wafers.

5 Claims, 6 Drawing Sheets

(56) References Cited

U.S. PATENT DOCUMENTS

| | | | | |
|---|---|---|---|---|
| 8,001,516 B2* | 8/2011 | Smith | ................ | G06F 30/39 |
| | | | | 716/132 |
| 9,837,381 B2* | 12/2017 | Heinrich | ................ | H01L 25/50 |
| 10,636,766 B2* | 4/2020 | Heinrich | ................ | H01L 24/97 |
| 11,508,694 B2* | 11/2022 | Heinrich | ............ | H01L 21/6835 |
| 2002/0140107 A1* | 10/2002 | Kato | ................ | H01L 25/0657 |
| | | | | 257/784 |
| 2003/0106209 A1* | 6/2003 | Farnworth | ............ | G01R 1/0466 |
| | | | | 29/841 |
| 2005/0132306 A1* | 6/2005 | Smith | ................ | G06F 30/39 |
| | | | | 716/114 |
| 2009/0031261 A1* | 1/2009 | Smith | ................ | G06F 30/39 |
| | | | | 716/132 |
| 2009/0074286 A1* | 3/2009 | Kitazawa | ............ | G01N 21/956 |
| | | | | 382/144 |
| 2010/0044858 A1* | 2/2010 | Cohn | ............... | H01L 21/76838 |
| | | | | 257/E23.179 |
| 2016/0111395 A1* | 4/2016 | Heinrich | ........... | H01L 23/49513 |
| | | | | 438/107 |
| 2018/0068982 A1* | 3/2018 | Heinrich | ........... | H01L 23/49503 |
| 2020/0219848 A1* | 7/2020 | Heinrich | ................ | H01L 23/13 |
| 2021/0351089 A1* | 11/2021 | Dror | ................ | H01L 21/67276 |

* cited by examiner

600↘

```
┌─────────────────────────────────────────────────────────────────────────────┐
│ Obtain a plurality of pieces of one or more semiconductor wafers. Each piece of the plurality of pieces │
│ includes a respective instance of a measurement test structure and an alignment mark. Each piece of │
│ the plurality of pieces has a known location from the one or more semiconductor wafers. (602) │
└─────────────────────────────────────────────────────────────────────────────┘
                                        ↓
┌─────────────────────────────────────────────────────────────────────────────┐
│ Bond each piece of the plurality of pieces to a substrate at a respective position on the substrate. (604) │
│ ┌─────────────────────────────────────────────────────────────────────────┐ │
│ │ The substrate has a plurality of trenches. Place each piece of the plurality of pieces in a respective │ │
│ │ trench of the plurality of trenches. (606) │ │
│ └─────────────────────────────────────────────────────────────────────────┘ │
│ ┌─────────────────────────────────────────────────────────────────────────┐ │
│ │ The substrate is wafer-shaped. (608) │ │
│ └─────────────────────────────────────────────────────────────────────────┘ │
│ ┌─────────────────────────────────────────────────────────────────────────┐ │
│ │ The substrate is carbon or silicon. (610) │ │
│ └─────────────────────────────────────────────────────────────────────────┘ │
└─────────────────────────────────────────────────────────────────────────────┘
                                        ↓
┌─────────────────────────────────────────────────────────────────────────────┐
│                  Load the substrate into a metrology tool. (612)            │
└─────────────────────────────────────────────────────────────────────────────┘
                                        ↓
┌─────────────────────────────────────────────────────────────────────────────┐
│ Align respective pieces of the plurality of pieces in the metrology tool, using the alignment mark. (614) │
└─────────────────────────────────────────────────────────────────────────────┘
                                        ↓
┌─────────────────────────────────────────────────────────────────────────────┐
│ For the respective pieces of the plurality of pieces, use the metrology tool to measure values of a │
│ parameter for respective instances of the measurement test structure. (616) │
└─────────────────────────────────────────────────────────────────────────────┘
                                        ↓
┌─────────────────────────────────────────────────────────────────────────────┐
│ Model the parameter as a function of location on the one or more semiconductor wafers, using the │
│ known locations of the respective pieces and the values of the parameter for the respective instances of │
│ the measurement test structure. (618) │
│ ┌─────────────────────────────────────────────────────────────────────────┐ │
│ │ Generate a model for the parameter. (620) │ │
│ └─────────────────────────────────────────────────────────────────────────┘ │
│ ┌─────────────────────────────────────────────────────────────────────────┐ │
│ │ Determine residuals for the parameter with respect to the model. (622) │ │
│ └─────────────────────────────────────────────────────────────────────────┘ │
└─────────────────────────────────────────────────────────────────────────────┘
                                        ↓
┌─────────────────────────────────────────────────────────────────────────────┐
│ Perform process control for a process used to fabricate the one or more semiconductor wafers, based at │
│ least in part on the residuals. (624) │
└─────────────────────────────────────────────────────────────────────────────┘
```

Figure 6

SUBSTRATE WITH CUT SEMICONDUCTOR PIECES HAVING MEASUREMENT TEST STRUCTURES FOR SEMICONDUCTOR METROLOGY

RELATED APPLICATION

This application claims priority to U.S. Provisional Patent Application No. 63/022,587, filed May 11, 2020, which is hereby incorporated by reference in its entirety for all purposes.

TECHNICAL FIELD

This disclosure relates to semiconductor metrology, and more specifically to a substrate with measurement test structures for semiconductor metrology.

BACKGROUND

Wafers with test structures used to research and develop new semiconductor fabrication processes are difficult to obtain. The desired test structures typically occupy a small portion of a reticle and thus of a wafer, making the production of dedicated reticles for test structures cost-prohibitive. And commercial vendors of test structures typically offer long turn-around times for design and manufacturing.

SUMMARY

In some embodiments, a device includes a substrate and a plurality of pieces from one or more semiconductor wafers. Each piece of the plurality of pieces is bonded to the substrate at a respective position on the substrate. Each piece of the plurality of pieces includes a respective instance of a measurement test structure and an alignment mark. Each piece of the plurality of pieces has a known location from the one or more semiconductor wafers.

In some embodiments, a method includes obtaining a plurality of pieces of one or more semiconductor wafers. Each piece of the plurality of pieces includes a respective instance of a measurement test structure and an alignment mark. Each piece of the plurality of pieces has a known location from the one or more semiconductor wafers. The method also includes bonding each piece of the plurality of pieces to a substrate at a respective position on the substrate.

In some embodiments, a system includes a substrate on which a plurality of pieces from one or more semiconductor wafers are bonded. Each piece of the plurality of pieces is bonded to the substrate at a respective position on the substrate. Each piece of the plurality of pieces includes a respective instance of a measurement test structure and an alignment mark. Each piece of the plurality of pieces has a known location from the one or more semiconductor wafers. The system also includes a metrology system that includes a metrology tool, one or more processors, and memory storing one or more programs for execution by the one or more processors. The one or more programs include instructions for aligning respective pieces of the plurality of pieces in the metrology tool, using the alignment mark, and for using the metrology tool, for the respective pieces of the plurality of pieces, to measure values of a parameter for respective instances of the measurement test structure.

BRIEF DESCRIPTION OF THE DRAWINGS

For a better understanding of the various described implementations, reference should be made to the Detailed Description below, in conjunction with the following drawings.

FIG. 6 is a flowchart illustrating a method of performing semiconductor metrology, in accordance with some embodiments.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
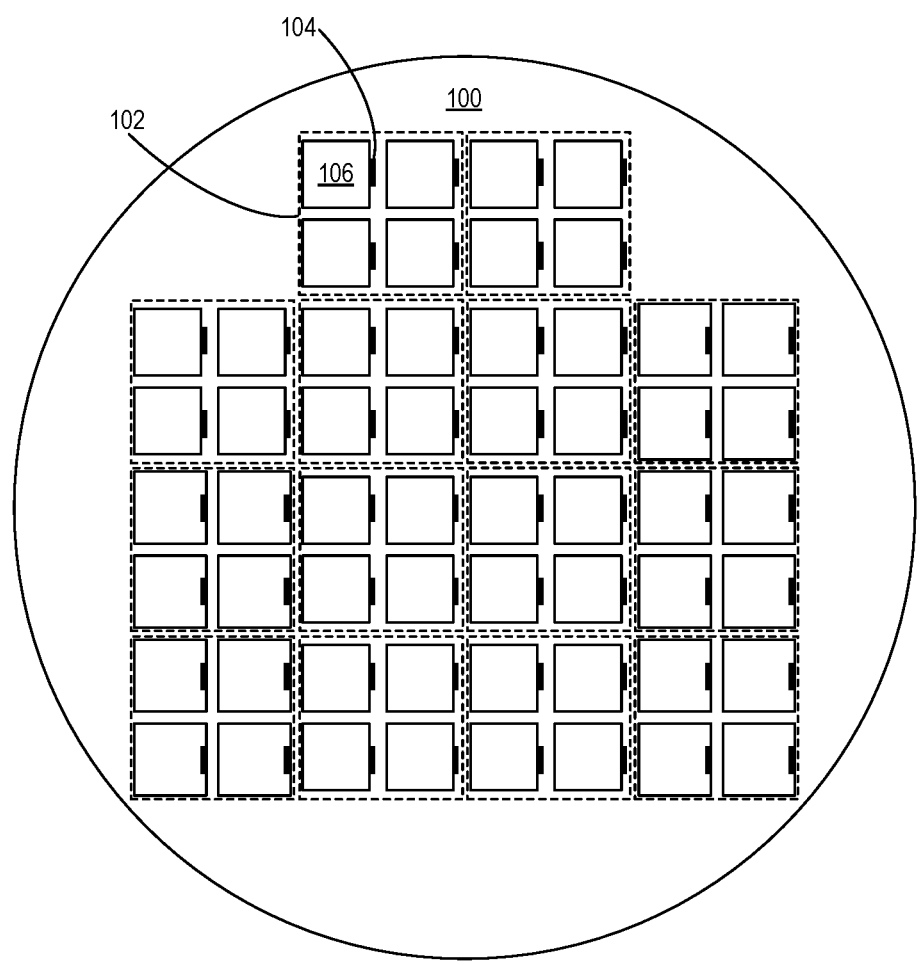
FIG. 1 shows a semiconductor wafer with various structures including measurement test structures fabricated on it.

FIG. 1 shows a semiconductor wafer 100 (e.g., a silicon wafer) with various structures fabricated on it. The various structures include multiple regions 104, each of which includes a measurement test structure. The measurement test structures in the regions 104 may be respective instances of the same measurement test structure. This measurement test structure may be designed so that metrology may be performed on it to measure one or more parameters associated with semiconductor fabrication. The one or more parameters may include geometric parameters (e.g., critical dimension (CD), overlay, sidewall angle, edge-placement error, film thickness, etc.) and/or fabrication process parameters (e.g., photolithographic focus, photolithographic dose, etc.). The measurement test structure may also be referred to as a metrology target. The various structures fabricated on the wafer 100 may further include semiconductor die 106, which may be instances of the same semiconductor device or multiple semiconductor devices, and/or other test structures besides the measurement test structures in the regions 104.

The semiconductor wafer 100 is divided into photolithographic fields 102. During fabrication, each photolithographic field 102 is exposed through a reticle in a single photolithographic exposure. The photolithographic fields 102, and thus the structures fabricated within them (including the regions 104 and die 106), are repeated across the wafer 100. Each photolithographic field 102 includes one or more instances of the regions 104. In the example of FIG. 1, each photolithographic field 102 includes four instances of the regions 104; other examples are possible.

The semiconductor wafer 100 may be cut up (e.g., sawed) to separate the various structures fabricated on it. This process of cutting up the wafer 100 produces a plurality of pieces 204 (FIG. 2, described below), each of which includes a respective region 104 and thus includes a respective instance of the measurement test structure. For example, each piece 204 includes a respective region 104 and nothing more. Each of the plurality of pieces 204 has a known location (e.g., x-y location) from which it came on the semiconductor wafer 100. That is, the location of the corresponding region 104 for each piece 204 is known. Knowledge of these locations is maintained after the pieces 204 have been cut from the wafer 100. For example, the respective location is encoded on each piece 204 (e.g., by blowing fuses on the region 104/piece 204). In another example, each piece 204 is stored in a container that is marked with the respective location or with a code that corresponds to the respective location. The code and the respective location may be stored in a database that is subsequently accessed to determine the location.

Pieces 204 may be cut from multiple wafers 100. Knowledge of the respective wafer 100 from which each piece 204 is cut, as well as the respective location on the respective wafer 100, may be maintained after the pieces 204 have been cut from the wafers 100 (e.g., by encoding this information on the piece 204 or marking a container with this information or a corresponding code). The code and an indicator of the respective wafer may be stored in the database.

Figure 2:
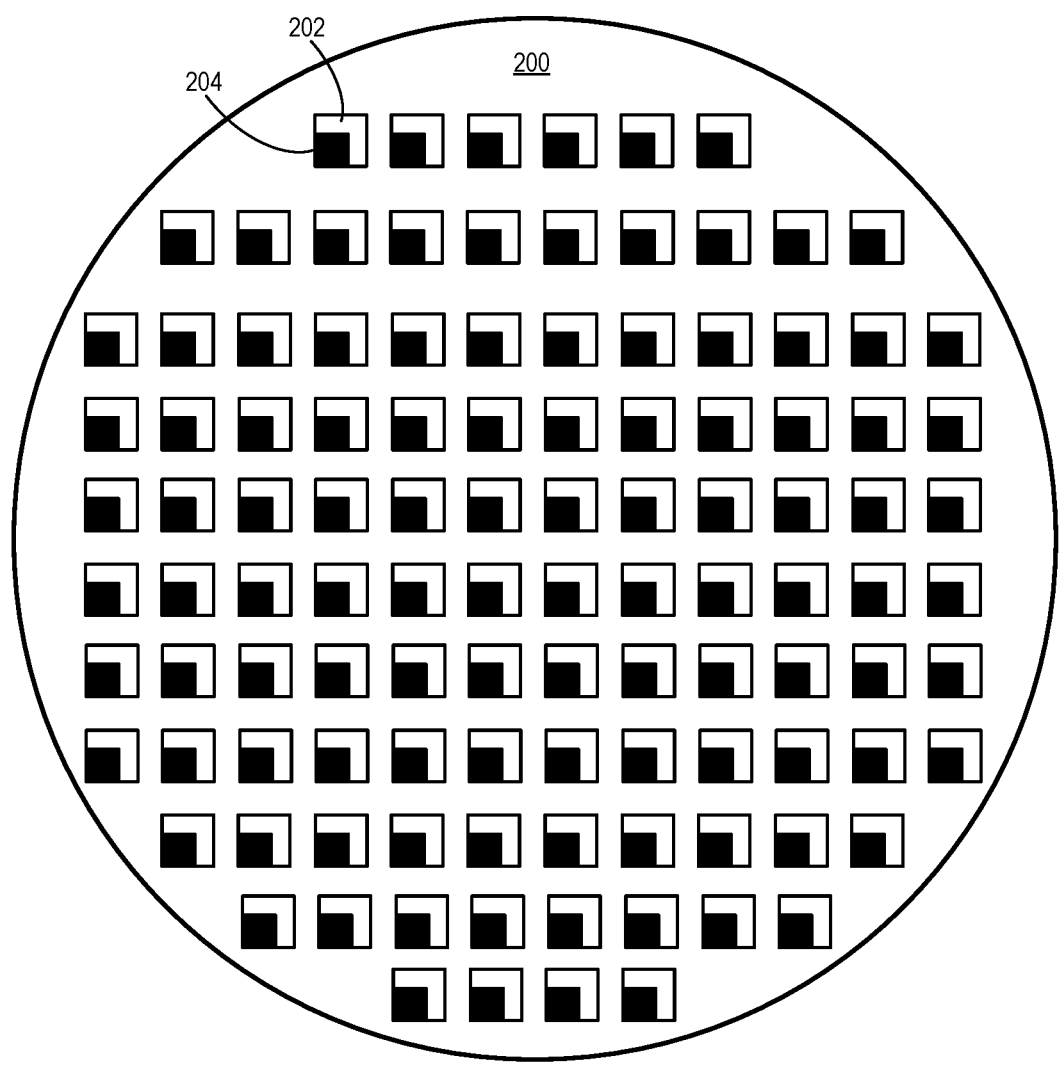
FIG. 2 shows a substrate on which pieces from the wafer of FIG. 1 that include respective measurement test structures have been bonded, in accordance with some embodiments.

The pieces 204 are bonded on a substrate. FIG. 2 shows a substrate 200 on which pieces 204 have been bonded (e.g., glued), in accordance with some embodiments. In some embodiments, the substrate 200 has a plurality of trenches 202. The trenches 202 may have been etched into the substrate 200. Each piece 204 is situated in a respective trench 202 of the plurality of trenches 202. The pieces 204 may be situated at the same relative positions within their respective trenches 202. For example, FIG. 2 shows the pieces 204 situated at the lower left corners of their respective trenches; other examples are possible.

Figure 3:
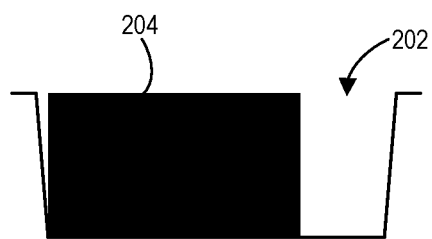
FIG. 3 shows a cross-section of a trench on the substrate of FIG. 2, with a piece from the wafer of FIG. 1 situated in the trench and bonded to the substrate, in accordance with some embodiments.

FIG. 3 shows a cross-section of a trench 202, with a piece 204 situated in the trench 202 and bonded (e.g., glued) to the substrate 200, in accordance with some embodiments. Situating the pieces 204 in the trenches 202 ensures that a metrology tool can take parameter measurements for the pieces 204 without crashing the head of the metrology tool into the pieces 204. In some embodiments, however, the trenches 202 are absent from the substrate 200. For example, the pieces 204 may be mounted on a flat surface of the substrate 200.

In some embodiments, the substrate 200 is carbon or silicon.

In some embodiments, the substrate 200 is wafer-shaped. For example, the substrate 200 may be a semiconductor wafer (e.g., a silicon wafer) (e.g., a bare semiconductor wafer or an otherwise bare semiconductor wafer with the trenches 202). In another example, the substrate 200 may be a wafer-shaped carbon substrate.

Knowledge of the locations of the pieces 204 on the semiconductor wafer(s) 100 from which the pieces 204 were cut (i.e., the locations of the corresponding regions 104) is maintained after the pieces 204 have been bonded to the substrate 200 (e.g., have been situated in the trenches 204). A database (e.g., location database 720, FIG. 7) may be generated that maps the location of each piece 204 on the semiconductor wafer 100 from which it was cut to the location on the substrate 200 at which the piece 204 is bonded to the substrate. For example, the database may map the location of each piece 204 on the semiconductor wafer 100 from which it was cut to the trench 204 in which the piece 204 is situated. If the plurality of pieces 204 were cut from multiple semiconductor wafers 100, knowledge of the wafer 100 from which each piece 204 was cut may also be maintained. For example, the wafer number of the wafer 100 from which each piece 204 was cut may be stored in the database, in association with the piece 204.

Figure 4:
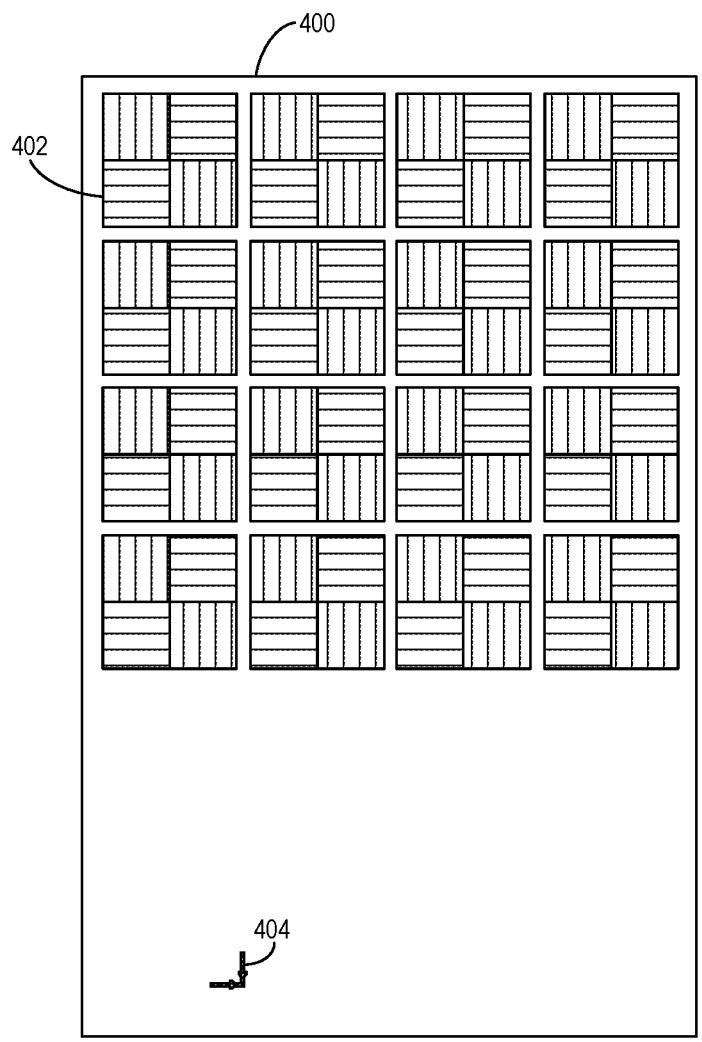
FIG. 4 shows an example of a piece that may be bonded to the substrate of FIG. 2, in accordance with some embodiments.

FIG. 4 shows a piece 400 in accordance with some embodiments. The piece 400 is an example of the piece 204 (FIG. 2) and may be bonded on the substrate 200 (FIG. 2). The piece 400 thus may be an example of each piece 204 of the plurality of pieces 204 on the substrate 200 (FIG. 2). The piece 400 includes a measurement test structure 402. In some embodiments, the measurement test structure 402 is periodic. For example, the measurement test structure 402 may include repeated instances of a sub-structure arranged in an array. In the example of FIG. 4, the array is a 4×4 array; other examples are possible. Alternatively, the measurement test structure 402 is aperiodic.

Figure 5:
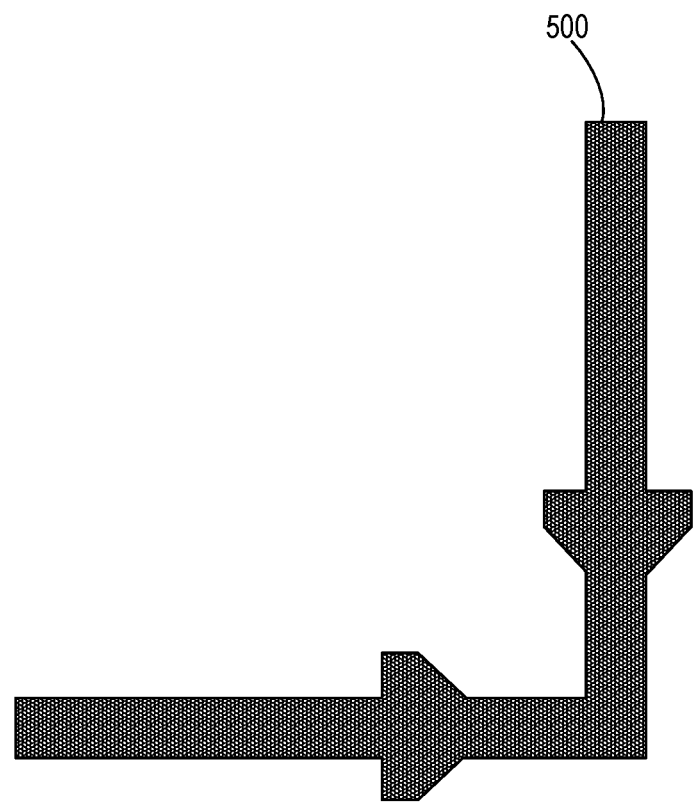
FIG. 5 shows an example of an alignment mark on the piece of FIG. 4, in accordance with some embodiments.

The piece 400 also includes an alignment mark 404 that a metrology tool may use to align the piece 400 and corresponding measurement test structure 402 before taking a parameter measurement. An example of the alignment mark 404 is the alignment mark 500, as shown in FIG. 5 in accordance with some embodiments.

The piece 400 may also contain fuses (not shown) that may be used to encode location and/or wafer information into the piece 400. For example, a blown fuse may represent a '1' and an unblown fuse may represent a '0', or vice-versa. In this binary manner, fuses may encode location coordinates and/or wafer numbers. By blowing fuses, the location and/or wafer information is hard-coded into the piece 400.

FIG. 6 is a flowchart illustrating a method 600 of performing semiconductor metrology, in accordance with some embodiments. In the method 600, a plurality of pieces (e.g., pieces 204, FIGS. 2-3; pieces 400, FIG. 4) of one or more semiconductor wafers (e.g., semiconductor wafer 100, FIG. 1) is obtained (602). Each piece of the plurality of pieces includes a respective instance of a measurement test structure (e.g., measurement test structure 402, FIG. 4) and an alignment mark (e.g., alignment mark 404, FIG. 4; alignment mark 500, FIG. 5). Each piece of the plurality of pieces has a known location from the one or more semiconductor wafers.

Each piece of the plurality of pieces is bonded (604) to a substrate (e.g., substrate 200, FIG. 2; substrate 732, FIG. 7) at a respective position on the substrate. In some embodiments, the substrate has a plurality of trenches (e.g., trenches 202, FIGS. 2-3). Each piece of the plurality of pieces is placed (606) in a respective trench of the plurality of trenches. In some embodiments, the substrate is (608) wafer-shaped. In some embodiments, the substrate is (610) carbon or silicon. For example, the substrate may be a silicon wafer (e.g., a bare silicon wafer or an otherwise bare silicon wafer with trenches).

Figure 7:
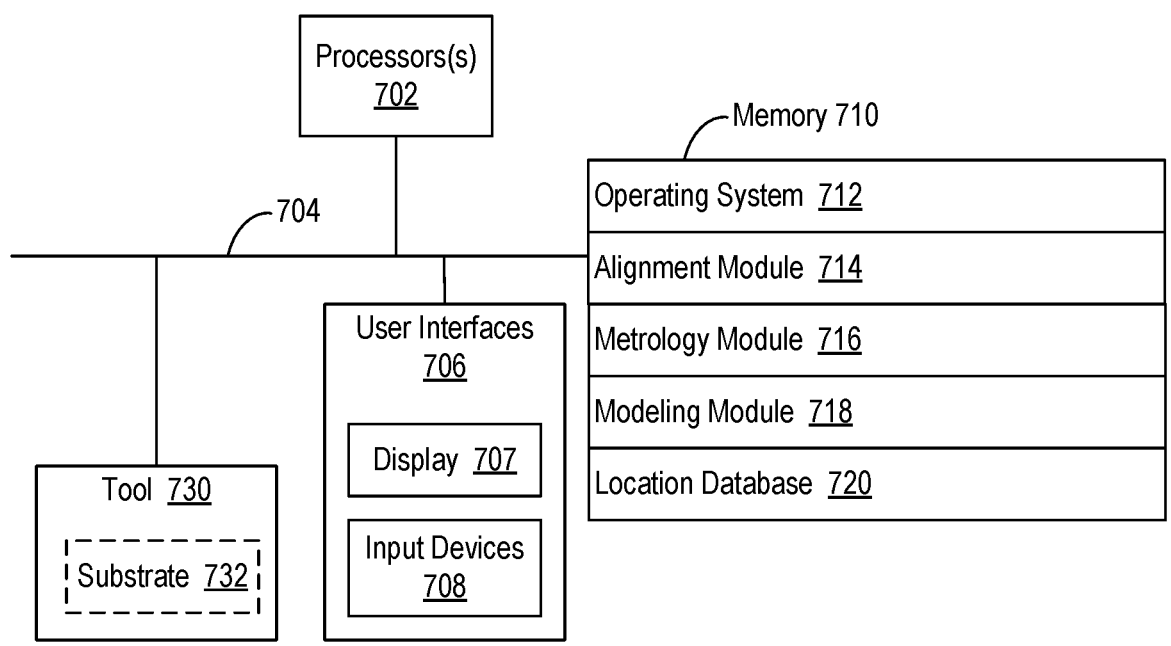
FIG. 7 is a block diagram of a semiconductor metrology system in accordance with some embodiments.

The substrate is loaded (612) into a metrology tool (e.g., metrology tool 730, FIG. 7). Respective pieces of the plurality of pieces are aligned (614) in the metrology tool, using the alignment mark. For the respective pieces, the metrology tool is used to measure values (616) of a parameter for respective instances of the measurement test structure. In some embodiments, to measure the values of the parameter, the metrology tool performs a metrology technique selected from the group consisting of optical critical-dimension (OCD) metrology (e.g., ellipsometry or scatterometry), scanning-electron microscopy, critical-dimension small-angle x-ray spectroscopy (CD-SAXS), and soft x-ray reflectometry. The metrology tool thus may be, for example, an OCD metrology tool, scanning electron microscope (SEM), critical-dimension small-angle x-ray spectroscope, or soft x-ray reflectometer. Other examples are possible. Examples of the parameter include, without limitation, a geometric parameter (e.g., CD, overlay, sidewall angle, edge-placement error, film thickness, etc.) or fabrication process parameters (e.g., photolithographic focus, photolithographic dose, etc.).

The parameter is modeled (618) as a function of location on the one or more semiconductor wafers, using the known locations of the respective pieces (e.g., the locations of the corresponding regions 104, FIG. 1) and the values of the parameter for the respective instances of the measurement test structure. In some embodiments, modeling the parameter includes generating (620) a model for the parameter and determining (622) residuals for the parameter with respect to the model.

Process control may be performed (624) for a process used to fabricate the one or more semiconductor wafers, based at least in part on the residuals. High residuals (e.g., residuals that do not satisfy a maximum threshold because they exceed, or equal or exceed, the maximum threshold) indicate that the process does not vary in a known manner across the semiconductor wafer(s) 100 and thus that the process is out of control. Process modifications may be made in response to high residuals, to bring the process better under control.

FIG. 7 is a block diagram of a semiconductor metrology system 700 in accordance with some embodiments. The semiconductor metrology system 700 includes a metrology tool 730 and a computer system with one or more processors 702 (e.g., CPUs), optional user interfaces 706, memory 710, and communication bus(es) 704 interconnecting these components. In some embodiments, the metrology tool 730 is communicatively coupled to the computer system through one or more wired and/or wireless networks. In some embodiments, the semiconductor metrology system 700 includes multiple metrology tools 730 communicatively coupled with the computer system. The computer system may further include one or more wired and/or wireless network interfaces for communicating with the metrology tool(s) 730 and/or remote computer systems.

The user interfaces 706 may include a display 707 and one or more input devices 708 (e.g., a keyboard, mouse, touch-sensitive surface of the display 707, etc.). The display 707 may display metrology results and/or parameter-modeling results.

A substrate 732 (e.g., substrate 200, FIG. 2) with pieces (e.g., pieces 204, FIGS. 2-3; pieces 400, FIG. 4) bonded to it may be loaded into the metrology tool 730. The metrology tool 730 may perform metrology to measure values of a parameter for respective pieces. Examples of the metrology tool 730 and the measured parameter include, without limitation, those listed for step 616 of the method 600 (FIG. 6).

Memory 710 includes volatile and/or non-volatile memory. Memory 710 (e.g., the non-volatile memory within memory 710) includes a non-transitory computer-readable storage medium. Memory 710 optionally includes one or more storage devices remotely located from the processors 702 and/or a non-transitory computer-readable storage medium that is removably inserted into the system 700. The memory 710 (e.g., the non-transitory computer-readable storage medium of the memory 710) includes instructions for performing steps of the method 600 (FIG. 6). For example, the memory 710 includes instructions for performing steps 612-622 of the method 600, or a portion thereof.

In some embodiments, memory 710 (e.g., the non-transitory computer-readable storage medium of memory 710) stores the following modules and data, or a subset or superset thereof: an operating system 712 that includes procedures for handling various basic system services and for performing hardware-dependent tasks, an alignment module 714 (e.g., for performing step 614 of the method 600, FIG. 6), a metrology module (e.g., for performing step 616 of the method 600, FIG. 6), a modeling module 718 (e.g., for performing step 618 of the method 600, FIG. 6, including for example steps 620-622 of the method 600), and a location database 720 for storing location and/or wafer data for the pieces on the substrate 732.

Each of the modules stored in the memory 710 corresponds to a set of instructions for performing one or more functions described herein. Separate modules need not be implemented as separate software programs. The modules and various subsets of the modules may be combined or otherwise re-arranged. In some embodiments, the memory 710 stores a subset or superset of the modules and/or data structures identified above.

FIG. 7 is intended more as a functional description of various features that may be present in a semiconductor metrology system than as a structural schematic. For example, the functionality of the computer system in the semiconductor metrology system 700 may be split between multiple devices. A portion of the modules stored in the memory 710 may alternatively be stored in one or more other computer systems communicatively coupled with the computer system of the semiconductor metrology system 700 through one or more networks.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A device, comprising:
a substrate; and
a plurality of pieces from one or more semiconductor wafers, wherein:
the one or more semiconductor wafers comprise a plurality of semiconductor die and a plurality of regions distinct from the plurality of semiconductor die;
each piece of the plurality of pieces is bonded to the substrate at a respective position on the substrate;
each piece of the plurality of pieces comprises a respective region of the plurality of regions;
each respective region of the plurality of regions comprises a respective instance of a measurement test structure and an alignment mark, and does not include any semiconductor die of the plurality of semiconductor die; and
each piece of the plurality of pieces has a known location from the one or more semiconductor wafers.

2. The device of claim 1, wherein:
the substrate has a plurality of trenches; and
each piece of the plurality of pieces is situated in a respective trench of the plurality of trenches.

3. The device of claim 1, wherein the substrate is wafer-shaped.

4. The device of claim 3, wherein the substrate is carbon or silicon.

5. The device of claim 1, wherein the known location from the one or more semiconductor wafers is encoded on each piece of the plurality of pieces.

\* \* \* \* \*